US008178600B2

(12) United States Patent
Kelly

(10) Patent No.: US 8,178,600 B2
(45) Date of Patent: *May 15, 2012

(54) CURABLE COMPOSITION

(75) Inventor: Michael DeWayne Kelly, North Wales, PA (US)

(73) Assignee: Rohm and Haas Company, Philadelpha, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/313,713

(22) Filed: Nov. 24, 2008

(65) Prior Publication Data

US 2009/0170978 A1    Jul. 2, 2009

Related U.S. Application Data

(60) Provisional application No. 61/009,134, filed on Dec. 26, 2007.

(51) Int. Cl.
*C08L 3/00* (2006.01)

(52) U.S. Cl. .................. 524/47; 524/27; 524/52

(58) Field of Classification Search .............. 524/15, 524/17, 20, 26, 28, 32, 35, 47, 55, 27, 52; 527/400
See application file for complete search history.

(56) References Cited

U.S. PATENT DOCUMENTS

| 4,076,917 | A | 2/1978 | Swift et al. |
| 4,948,647 | A | 8/1990 | Burkard |
| 5,403,875 | A | 4/1995 | Bortnick et al. |
| 5,409,973 | A | 4/1995 | Bastioli et al. |
| 5,661,213 | A * | 8/1997 | Arkens et al. ................. 524/555 |
| 5,705,563 | A | 1/1998 | Wendel et al. |
| 5,895,804 | A | 4/1999 | Lee et al. |
| 6,071,994 | A * | 6/2000 | Hummerich et al. ......... 524/247 |
| 6,162,839 | A * | 12/2000 | Klauck et al. .................. 521/83 |
| 6,299,936 | B1 | 10/2001 | Reck et al. |
| 6,838,163 | B2 | 1/2005 | Smith et al. |
| 6,878,321 | B2 | 4/2005 | Hauber et al. |
| 7,026,390 | B2 | 4/2006 | O'Brien-Bernini |
| 7,199,179 | B2 * | 4/2007 | Clamen et al. ................ 524/560 |
| 7,399,818 | B2 * | 7/2008 | Bromm et al. ............. 526/317.1 |
| 2005/0221705 | A1 | 10/2005 | Hitch |
| 2005/0233657 | A1 | 10/2005 | Grove et al. |
| 2006/0029786 | A1 | 2/2006 | Wang et al. |
| 2006/0111480 | A1 * | 5/2006 | Hansen et al. ................... 524/27 |
| 2007/0010651 | A1 * | 1/2007 | Finch et al. .................... 528/310 |
| 2007/0012414 | A1 | 1/2007 | Kajander et al. |
| 2007/0059513 | A1 | 3/2007 | Yu et al. |
| 2007/0148430 | A1 | 6/2007 | Agrawal |
| 2007/0292619 | A1 * | 12/2007 | Srinivasan et al. ............ 427/384 |

FOREIGN PATENT DOCUMENTS

| EP | 0044614 | A2 | 1/1982 |
| EP | 0 409 788 | A | 11/1991 |
| EP | 1 801 278 | A1 | 6/2007 |
| JP | 1-161076 | | 6/1989 |
| JP | 4-185771 | | 7/1992 |
| JP | 7-157518 | | 6/1995 |
| JP | 10-088090 | | 4/1998 |
| JP | 10-158616 | | 6/1998 |
| JP | 10-272839 | | 10/1998 |
| JP | 2006-028344 | | 2/2006 |
| WO | 2009080938 | A2 | 2/2009 |

\* cited by examiner

*Primary Examiner* — David W Wu
*Assistant Examiner* — Marie Reddick
(74) *Attorney, Agent, or Firm* — Andrew E. C. Merriam

(57) ABSTRACT

A curable binder composition comprising an emulsion polymer and a natural binder.

8 Claims, No Drawings

CURABLE COMPOSITION

This application claims priority from U.S. Provisional Application 61/009,134 filed Dec. 26, 2007.

This invention is a curable composition useful as a thermosetting binder for a variety of applications, particularly for substrates that need to retain at least some flexibility. More particularly, the present invention relates to aqueous binder compositions comprising one or more polycarboxy emulsion copolymer and at least one natural binder, and the use thereof as thermosetting binders.

Due to their excellent cost/performance ratio, the thermosetting binder resins of choice in the past have been phenol/formaldehyde or urea/formaldehyde resins. However, curable compositions containing little or no formaldehyde are now highly desirable in a variety of products, due to the health and environmental problems associated with formaldehyde. Existing commercial formaldehyde-free binders contain a carboxylic acid polymer and a polyol that esterify and form a thermoset when heat cured. Commercial binders have typically been designed to afford a binder that when cured is substantially rigid. For example, in fiberglass insulation binders, the cured binders must allow the insulation to be compressed, but have rigidity that allows the compressed insulation to recover substantially to its original shape once compressive forces are removed. This allows, for example, the insulation to be shipped in a rolled, compressed state and unrolled before installation to release the compression, and allow a fluffy, heat-insulating mat to be installed.

However, for other applications, the rigid binders of the type described above are undesirable. For example, in thin fiberglass or polyester mats that are to be used in roofing, the mat must be held together with a binder that allows the mat to flex substantially after the binder is cured, to allow the mat to be processed further (e.g., to convert mat into roofing material), and allow the end product containing the mat to flex well in use. For example, in roofing mat, the end roofing product may be impregnated or layered with asphaltic materials, and the resultant roofing product must retain flexibility to allow it to conform to the roof (e.g., bend over peaks and into valleys), and to allow the roofing material to expand and contract with temperature fluctuations, without the mat itself fracturing because it is too brittle and lacks flexibility.

Other applications where curable, formaldehyde-free binders that are "flexible" in this regard include paper, cellulosics, polyester, glass mat, and glass veil. Such substrates are used in a variety of applications, including flooring underlayments, filtration media, and building products.

U.S. Pat. No. 5,895,804 discloses a starch-based thermosetting binder with soluble polycarboxy polymers. However, given that soluble polymers have a relatively high acid monomer content, these types of binders tend to be stiff and unsuitable for flexible substrates.

There remains a need for an inexpensive, formaldehyde-free, thermoset binder that retains both flexibility and strength after cure. The inventor has surprisingly found a solution to this problem in the compositions described herein, which comprise a polycarboxy emulsion copolymer and a natural product binder. Moreover, the inventive composition does not require the relatively expensive polyol crosslinker additives often used in the art. In a preferred embodiment, the carboxy emulsion copolymer comprises one or more multi-ethylenically unsaturated monomer, which further improves the strength of the cured composition. Thus, this invention is a formaldehyde-free binder that retains flexibility and strength after cure.

This invention is an aqueous binder composition comprising:
a. polymer particles of at least one polycarboxy emulsion copolymer having from 5-40% by weight of a carboxy acid polymer monomer, in polymerized form, in the copolymer;
b. at least one natural binder selected from the group consisting of a polysaccharide, or a vegetable protein, or lignin, or lignosulfonate, or mixtures thereof, the natural binder being present in a weight percent on total composition binder solids from 20-95%.

Other aspects of this invention are discussed below.

In one embodiment, the preferred carboxy acid monomer is acrylic acid. Preferably, the acrylic acid is from 10 to 20% by weight of the polycarboxy emulsion copolymer.

In another embodiment, the polycarboxy emulsion copolymer comprises from 0.1 to 5 weight percent of a multi-ethylenically unsaturated monomer. Preferably, the multi-ethylenically unsaturated monomer is allyl methacrylate.

In another embodiment, the natural binder comprises a water-soluble starch with a weight average molecular weight of less than 10,000.

In another embodiment, the natural binder comprises a water-insoluble starch with a weight average molecular weight of between 10,000 and 10,000,000.

In another embodiment, the natural binder comprises defatted soy flour.

In another embodiment, the polycarboxy emulsion copolymer comprises copolymerized acrylonitrile.

In another embodiment, the natural binder is pre-cooked with citric acid. The emulsion copolymer used in the binder of this invention includes, as copolymerized units, from 5% to 40%, or 5% to 30%, preferably from 10% to 30%, or 10% to 20%, or 12% to 20%, most preferably 14% to 17%, by weight based on the weight of the emulsion copolymer solids, of a carboxy monomer bearing a carboxylic acid group, anhydride group, or salt thereof or hydroxyl-group, such as (meth) acrylic acid and hydroxyethyl(meth)acrylate. Ethylenically unsaturated carboxylic acid monomer include, for example, methacrylic acid, acrylic acid, crotonic acid, fumaric acid, maleic acid, 2-methyl maleic acid, itaconic acid, 2-methyl itaconic acid, a,b-methylene glutaric acid, monoalkyl maleates, and monoalkyl fumarates; ethylenically unsaturated anhydrides such as, for example, maleic anhydride, itaconic anhydride, acrylic anhydride, and methacrylic anhydride; and salts thereof. Acrylic acid is the preferred carboxy monomer.

Ethylenically unsaturated co-monomers useful in the polycarboxy emulsion copolymer include acrylic ester monomers such as methyl acrylate, ethyl acrylate, butyl acrylate, 2-ethylhexyl acrylate, decyl acrylate, methyl methacrylate, butyl methacrylate, isodecyl methacrylate, hydroxyethyl acrylate, hydroxyethyl methacrylate, and hydroxypropyl methacrylate; (meth)acrylamide or substituted (meth)acrylamides; styrene or substituted styrenes; butadiene; vinyl acetate or other vinyl esters; acrylonitrile or methacrylonitrile; and the like. Styrene-acrylic latexes or all-acrylic latexes are well-suited to the performance requirements of the targeted end products.

In one embodiment, the latex emulsion (co)polymer of this invention comprises one or more copolymerized multi-ethylenically unsaturated monomers such as, for example, allyl methacrylate (ALMA), allyl acrylate, diallyl phthalate, 1,4-butylene glycol dimethacrylate, 1,2-ethylene glycol dimethacrylate, 1,6-hexanediol diacrylate, butadiene, trimethylolpropane triacrylate (TMPTA) and divinyl benzene. Of these, ALMA, divinylbenzene (DVB), diallyl phthalate, 1,4-butylene glycol dimethacrylate, and 1,6-hexanediol diacrylate are preferred. ALMA is the most preferred. The multi-ethylenically unsaturated monomer can be effectively employed at levels as low as 0.1%, by weight based on the weight of the copolymer, preferably from 0.1 to 10%, or 0.1 to 5%, more preferably from 0.1 to 4%, or 0.2 to 4%, and most preferably from 0.1 to 2%, or 0.2 to 2%, or 0.25 to 2%, or 1.0 to 2%, by weight based on the weight of the copolymer.

Chain transfer agents such as mercaptans, polymercaptans, and halogen compounds can be used in the polymerization mixture in order to moderate the molecular weight of the copolymer composition. Generally, from 0% to 10% by weight, based on the weight of the emulsion copolymer, of $C_4$-$C_{20}$ alkyl mercaptans, mercaptopropionic acid, or esters of mercaptopropionic acid, can be used. Preferably, the emulsion copolymer used in this invention has a Tg of between 0-35° C., preferably 10-20° C., for non-treated substrates having an inherent elongation of greater than 5%, such as spunbond polyester; and between 35-70° C. for non-treated substrates having an inherent elongation of less than 5%, such as glass mat, as measured by differential scanning calorimetry per ASTM 3418/82, midpoint temperature; cell calibration using an indium reference for temperature and enthalpy.

The emulsion copolymer used in this invention has weight average molecular weight of between 5,000 to 2,000,000, preferably between 20,000 and 1,000,000. For applications requiring high performance at elevated temperatures, the emulsion copolymer most preferably has a weight average molecular weight of 100,000 to 1,000,000, however, for some room temperature applications, the molecular weight is most preferably between 30,000 and 600,000.

The emulsion polymer preferably comprises about 5-80%, or 20-80% weight percent of the total solids in the binder, preferably 30-70%, or 30-60%, most preferably 40-60%, or 40-50%.

The aqueous binder composition also comprises at least one natural binder selected from the group consisting of a polysaccharide or a vegetable protein, or lignin, or lignosulfonate, or mixtures thereof.

The polysaccharides useful in the binder of this invention include those selected from the group consisting of starch, cellulose, gums, alginates, chitosan, pectin, gellan and modifications or derivatives thereof which are provided by etherification, esterification, acid hydrolysis, dextrinization, oxidation or enzyme treatment. Such polysaccharides can be derived from natural products, including plant, animal and microbial sources. Examples of polysaccharides include starch, cellulose, gums such as guar and xanthan, alginates, chitosan, pectin and gellan. Polysaccharide starches include maize or corn, waxy maize, high amylose maize, potato, tapioca and wheat starches. Other starches include varieties of rice, waxy rice, pea, sago, oat, barley, rye, amaranth, sweet potato, and hybrid starches available from conventional plant breeding, e.g., hybrid high amylose starches having amylose content of 40% or more, such as high amylose corn starch. Also useful are genetically engineered starches such as high amylose potato and potato amylopectin starches.

The polysaccharides may be modified or derivatized, such as by etherification, esterification, acid hydrolysis, dextrinization, oxidation or enzyme treatment (e.g., with alpha-amylase, beta-amylase, pullulanase, isoamylase, or glucoamylase), or bio-engineered. Hydroxyethylated corn starch is preferred.

The polysaccharide used in this inventive binder composition can have a weight average molecular weight of less than 10,000. However, it preferably has a weight average molecular weight of at least 10,000 and preferably is 100,000 or more (e.g. as high as 1,000,000 or even as high as 10,000,000). Weight average molecular weight of the polysaccharide is measured using gel permeation chromatography with laser light scattering.

Vegetable protein can also be used as a natural binder in this invention. A particularly preferred protein binder is soy protein. The vegetable "protein" material can be in the form of ground whole beans (including the hulls, oil, protein, minerals; etc.), a meal (extracted or partially extracted), a flour (i.e., generally containing less than about 1.5% oil and about 30-35% carbohydrate), or an isolate (i.e., a substantially pure protein flour containing less than about 0.5% oil and less than about 5% carbohydrate). As used herein, "flour" includes within its scope material that fits both the definitions of flour and isolate. Preferably, the vegetable protein is in the form of a protein flour, such as soy flour, at least because the binder and related fiber mat products produced from the binder made with a flour, as opposed to a meal, have more desirable physical properties.

Any source of soy protein (such as soybean flour or soybean meal) is suitable for use as the binder modifier in the present invention. Protein-rich soybean-derived flours, such as soy protein isolate, protein concentrate and ordinary defatted soy flour, which contain in the range of about 20-95% protein, should each be suitable. Of these, ordinary soy flour is the most abundant and cost-effective. The source of soy protein is preferably essentially free of functional urease. Information on soy protein can be found in, for example, Kirk-Othmer, Encyclopedia of Chemical Technology, Fourth Edition, Volume 22, pp. 591-619 (1997).

Other vegetable-like proteins useful as the natural binder in this invention, in addition to soy and corn vegetable protein include, to the extent they contain protein, flours made from other varieties of other leguminous beans and seeds, such as sunflower and rape-seeds.

Preferably, the vegetable protein has a particle size (as determined by the largest dimension) of less than about 0.1 inch (0.25 cm), and more preferably less than about 0.05 inch (0.125 cm). If the particle size is much larger than this, the protein material may not be sufficiently soluble or dispersible to produce a binder suitable for making fiber mats with optimum properties. As a consequence, the resultant fiber mats may have lessened tensile properties and less visual aesthetics. In those embodiments where the protein is blended with the resin before application to the fiber mat, the time required to solubilize the material tends to be undesirably longer with larger particles. Alternatively, if the protein is applied to the wet-laid mat separate from the remaining components of the binder, one may not get a smooth, aesthetically acceptable cured mat using larger sized particles.

For these reasons, a protein flour is more preferred because of its generally smaller particle size distribution. That is, the most preferred ground vegetable protein has a maximum particle size of that of a flour, i.e., about 0.005 inch (0.013 cm). There does not appear to be a minimum particle size requirement for the ground vegetable protein; however, the particle size of commercially available soybean flour is generally less than about 0.003 inch (0.008 cm). For example, in some commercially available soybean flour, greater than about 92% passes through a 325 mesh screen, which corresponds to a particle size of less than about 0.003 inch (0.008 cm). Thus, a wide range of soy flours are expected to be suitable, such as a flour having at least 90 to 95% of its particles smaller than 100 mesh, smaller than 200 mesh, or smaller than 400 mesh.

The natural binder (whether it is polysaccharide, or vegetable protein, or lignin, or lignosulfonate, or a combination thereof) preferably comprises about 20-95%, or 20-80% weight percent of the total solids in the binder, preferably 30-70%, or 40-70%, most preferably 40-60%, or 50-60%.

The binder of this invention can optionally include a soluble addition (co)polymer, containing at least two carboxylic acid groups, anhydride groups, or salts thereof. Ethylenically unsaturated carboxylic acids such as, for example, methacrylic acid, acrylic acid, crotonic acid, fumaric acid, maleic acid, 2-methyl maleic acid, itaconic acid, 2-methyl itaconic acid; ethylenically unsaturated anhydrides such as, for example, maleic anhydride, itaconic anhydride, acrylic anhydride, and methacrylic anhydride; and salts thereof, at a level of at least 70% by weight based on the weight of the soluble addition (co)polymer, may be used. Additional ethylenically unsaturated monomer may include acrylic ester monomers, including methyl(meth)acrylate, ethyl(meth)acrylate, butyl(meth)acrylate, 2-ethylhexyl acrylate, etc.

The soluble addition (co)polymer containing at least two carboxylic acid groups, anhydride groups, or salts thereof may have a molecular weight from about 1,000 to 150,000.

The soluble addition (co)polymer containing at least two carboxylic acid groups, anhydride groups, or salts thereof may be used at a level from 0%-30% by weight based on the total weight of solids of the polycarboxy emulsion copolymer.

In one embodiment of the invention, the composition further contains at least one low molecular weight polybasic carboxylic acid, anhydride or salt thereof having a molecular weight of 1000 or less, preferably 500 or less, and most preferably 200 or less. "Polybasic" means having at least two reactive acid or anhydride functional groups. Examples of suitable low molecular weight polybasic carboxylic acids and anhydrides include, for example, maleic acid, maleic anhydride, fumaric acid, succinic acid, succinic anhydride, sebacic acid, azelaic acid, adipic acid, citric acid, glutaric acid, tartaric acid, itaconic acid, trimellitic acid, hemimellitic acid, trimesic acid, tricarballytic acid, 1,2,3,4-butanetetracarboxylic acid, pyromellitic acid, oligomers of carboxylic acid, and the like. When used, preferably, the low molecular weight polybasic carboxylic acid, anhydride or salt thereof is pre-cooked, under reactive conditions, with the polysaccharide or natural protein, or lignosulfonate, prior to mixing with the polycarboxy emulsion copolymer. Most preferably, citric acid is used as the polybasic acid, and hydroxyethylated corn starch is used as the polysaccharide. See, for example, the description "preparation of pre-cooked starch" in the Examples section.

In one embodiment of this invention, the binder composition comprises a phosphorous-containing accelerator such as those disclosed in U.S. Pat. No. 6,136,916. Preferably, the accelerator is selected from the group consisting of sodium hypophosphite, sodium phosphite, or a mixture thereof. The phosphorous-containing accelerator can also be an oligomer bearing phosphorous-containing groups such as, for example, an oligomer of acrylic acid formed in the presence of sodium hypophosphite by addition polymerization, but a separate compound from any soluble polymer serving as part of the binder of the curable composition of the present invention. The one or more phosphorous-containing accelerator may be used at a level of from 0 wt. % to 40 wt. %, based on the total weight of binder solids. The phosphorous-containing accelerators may be used in the amount of 0.1 wt. % or more, based on the total weight of binder solids, and up to 25 wt. %, or up to 20 wt. %, or, preferably, up to 15 wt. %, and, more preferably, up to 12 wt. %. When the phosphorous-containing accelerator comprises part of an addition (co)polymer or (co)oligomer, the wt. % of the phosphorous-containing accelerator is based on/determined by wt % of hypophosphite, phosphinate or phosphonate charged to the reactor as a fraction of the total solids. Preferably sodium hypophosphite is used, and its weight percent based on total carboxyl acid weight from the emulsion polymer and the soluble polymer (if it is used) is from about 1%-20%, preferably 5%-15%.

In a particularly preferred embodiment, the aqueous binder composition comprises approximately 50-60% by weight, based on the total weight of binder solids, of a pre-cooked hydroxyethylated starch as the natural binder, and a styrene-acrylic polycarboxy emulsion copolymer comprising approximately 15% of acrylic acid and approximately 1-2% of allyl methacrylate, in both cases the percentage is percent by weight of the polycarboxy emulsion copolymer. Sodium hypophosphate may be added during the polymerization or post-added, preferably at a level of 6% by weight based on the carboxyl acid weight of the emulsion polymer. Polymer Examples 4 and 5, and the corresponding Binder Examples 4 and 5, described below, are representative of this embodiment.

The binder of this invention can contain, in addition, conventional treatment components such as, for example, emulsifiers; pigments; fillers or extenders; anti-migration aids; curing agents; coalescents; surfactants, particularly nonionic surfactants; spreading agents; mineral oil dust suppressing agents; biocides; plasticizers; organosilanes; anti-foaming agents such as dimethicones, silicone oils and ethoxylated nonionics; corrosion inhibitors, particularly corrosion inhibitors effective at pH<4 such as thioureas, oxalates, and chromates; colorants; antistatic agents; lubricants; waxes; antioxidants; coupling agents such as silanes, particularly Silquest™ A-187 (manufactured by GE Silicones—OSi Specialties, located in Wilton Conn.); polymers not of the present invention; and waterproofing agents such as silicones and emulsion polymers, particularly hydrophobic emulsion polymers containing, as copolymerized units, greater than 30% by weight, based on the weight of the emulsion polymer solids, ethylenically-unsaturated acrylic monomer containing a C5 or greater alkyl group.

Additionally, this invention includes methods for treating substrates comprising:
Forming the wet, uncured web of fibers, and preferably transferred to a moving screen running through a binder application station where the aqueous binder of the invention is applied to the mat. The binder can be applied to the structure by any suitable means including, for example, air or airless spraying, padding, saturating, roll coating, curtain coating, beater deposition, coagulation or dip and squeeze application, and the resultant saturated wet bindered web laying on a supporting wire or screen is run over one or more vacuum boxes to remove enough binder to achieve the desired binder content in the mat. The binder level in the inventive mats can range from about 10 to about 35 wt. percent of the finished dry mat, preferably about 15 to about 30 wt. percent and most preferably from about 20 to about 30 wt. percent, such as about 25+/−3 wt. percent. The binder composition is curable by the application of heat, i.e., the binder composition is a thermosetting composition.

As used herein, the phrase "alkyl" means any aliphatic alkyl group having one or more carbon atoms, the alkyl group including n-alkyl, s-alkyl, i-alkyl, t-alkyl groups or cyclic aliphatics containing one or more 5, 6 or seven member ring structures.

As used herein, the phrase "aqueous" or "aqueous solvent" includes water and mixtures composed substantially of water and water-miscible solvents.

As used herein, "wt %" or "wt. percent" means weight percent based on solids.

As used herein, the phrase "based on the total weight of binder solids" or "weight percent of the total solids in the binder" refers to weight amounts of any given ingredient in comparison to the total weight amount of all the non-water ingredients in the binder (e.g., emulsion copolymers, natural binder, soluble polyacids, and the like). Binders of this invention can be aqueous or dry (with water optionally added prior to application to a substrate).

As used herein, unless otherwise indicated, the word "copolymer" includes, independently, copolymers, terpolymers, block copolymers, segmented copolymers, graft copolymers, and any mixture or combination thereof. (Co) polymer means homopolymer or copolymer.

As used herein, the phrase "emulsion polymer" means polymers dispersed in an aqueous medium that has been prepared by emulsion polymerization.

As used herein, the phrase "formaldehyde-free composition" refers to compositions substantially free from added formaldehyde, and which do not liberate substantial formaldehyde as a result of drying and/or curing.

As used herein, the term "(meth)acrylate" means acrylate, methacrylate, and mixtures thereof and the term "(meth) acrylic" used herein means acrylic, methacrylic, and mixtures thereof.

As used herein, the phrases "$(C_3$-$C_{12})$—" or "$(C_3$-$C_6)$—" and the like refer to organic compounds or structural portions of organic compounds containing 3 to 12 carbon atoms and 3 to 6 carbon atoms, respectively.

As used herein, unless otherwise indicated, the phrase "molecular weight" refers to the weight average molecular weight of a polymer as measured by gel permeation chromatography (GPC). Gel permeation chromatography, otherwise known as size exclusion chromatography, actually separates the members of a distribution of polymer chains according to their hydrodynamic size in solution rather than their molar mass. The system is then calibrated with standards of known molecular weight and composition to correlate elution time with molecular weight. The techniques of GPC are discussed in detail in Modern Size Exclusion Chromatography, W. W. Yau, J. J Kirkland, D. D. Bly; Wiley-Interscience, 1979, and in A Guide to Materials Characterization and Chemical Analysis, J. P. Sibilia; VCH, 1988, p. 81-84.

The molecular weight information for a low molecular weight sample (e.g., 10,000) is determined as follows: The sample (an aqueous emulsion containing low molecular weight particles) is dissolved in THF at a concentration of approximately 0.1% weight sample per volume THF, and shaken for 6 hours, followed by filtration through a 0.45 μm PTFE (polytetrafluoroethylene) membrane filter. The analysis is performed by injecting 100 μl of the above solution onto 3 columns, connected in sequence and held at 40° C. The three columns are: one each of PL Gel 5 100, PL Gel 5 1,000, and PL Gel 5 10,000, all available from Polymer Labs, Amherst, Mass. The mobile phase used is THF flowing at 1 ml/min. Detection is via differential refractive index. The system is calibrated with narrow polystyrene standards. PMMA-equivalent molecular weights for the sample are calculated via Mark-Houwink correction using $K=14.1\times10^{-3}$ ml/g and $a=0.70$ for the polystyrene standards and $K=10.4\times10^{-3}$ m/g and $a=0.697$ for the sample.

The binders of this invention are useful to bind non-woven webs, among other things. "Non-woven web(s)" refers to any article or sheet-like form made from natural and/or synthetic fibers wherein the fibers are aligned in a random or semi-random order (i.e., not deliberately ordered). One skilled in the art understands that formation of some order occurs during the web forming process (primarily in the machine direction); however, this is completely different from the ordering obtained from traditional weaving or knitting processes. Suitable fibers for use in forming the web include, but are not limited to, fiberglass, cellulose, modified cellulose (cellulose acetate), cotton, polyesters, rayon, polyacrylonitrile (PAN), polylactic acid (PLA), polycaprolactone (PCL), polyolefins and bi-component fiber comprising two or more fiber-forming polymers such as polypropylene and polyethylene terephthalate and the like. Included in the definition of non-woven webs suitable for use with this invention are porous films prepared by the action of chemical or mechanical processing (e.g., apertured films). Also included as useful for the purpose of this invention are paper and paper products. The present invention will find utility with any weight of non-woven web and will depend greatly on the requirements of the particular application. Manufacturing processes for making non-woven webs are well known in the art. These include, for example, wet-laid, air-laid (dry laid), spunbond, spunlace, meltblown and needle punch. Particularly suitable webs will have a base weight (i.e., the weight of the web before any coating or treatments are applied) of less than about 100 grams per square meter (gsm). In another aspect the webs will have a base weight of less than about 20 gsm.

U.S. Patent Publication 20060121099 describes a commercial process for cooking and applying starch to non-wovens that can be employed in practicing an embodiment of this invention. Specifically, the starch can be cooked and spray dried and applied to a non-woven substrate, followed by application of the other binder components of this invention either in aqueous or dried form. After application, the binder can be cured by heating the coated non-woven to a sufficient temperature where it cures on the substrate. As far as cooking the starch, processes such as those described in Papermaking Science and Technology Book 11 Pigment Coating and Surface Sizing of Paper, published by Fapet Oy and printed by Gummerus Printing (2000) pp. 338-340, or other methods of processing starch such as those described in pages 340-343 can be used in the practice of this invention. Preferably, when starch is used as the natural binder in this invention, it is cooked before application onto the substrate, and the other binder ingredients are either mixed with the cooked starch before or after application of the starch to the substrate. Preferably, a jet cooker is employed where the starch is cooked and spray-dried onto the substrate.

Preferably, the binder compositions are formaldehyde-free. To minimize the formaldehyde content of the aqueous composition, it is preferred, when preparing a polymer-containing formaldehyde-free curable composition, to use polymerization adjuncts and additives such as, for example, initiators, reducing agents, chain transfer agents, curing agents, biocides, surfactants, emulsifiers, coupling agents, anti-foaming agents, dust suppressing agents, fillers and the like, which are themselves free from formaldehyde, do not generate formaldehyde during the polymerization process, and do not generate or emit formaldehyde during the treatment of heat-resistant nonwovens.

In one embodiment, the curable compositions may optionally contain one or more strong acids, wherein the strong acid has a pKa of $\leq 3.0$. The composition may contain up to 0.2 equivalents of a strong acid, relative to the equivalents of total carboxylic acid from the emulsion polymer and the optional soluble polymer, such as from 0.01 to 0.18 equivalents. The strong acid may be a mineral acid, such as, for example, sulfuric acid, or an organic acid, such as, for example, a sulfonic acid. Mineral acids are preferred.

In drying (if applied in aqueous form) and curing the curable compositions, the duration, and temperature of heating, will affect the rate of drying, ease of processing or handling, and property development of the treated substrate. Suitable heat treatment at 100° C. or more, and up to 400° C., may be maintained for from 3 seconds to 15 minutes. Preferably, heat treatment temperatures range 150° C. or higher; such preferred heat treatment temperatures may range up to 225° C., or, more preferably, up to 200° C. or, when using one or more phosphorous-containing accelerator, up to 150° C. Where the substrate contains wood, temperatures of 100° C. to 220° C., are preferred.

Drying and curing can be done in two or more distinct steps, if desired. For example, the curable composition can be first heated at temperatures and for times sufficient to substantially dry, but not to substantially cure the composition, followed by heating for a second time, at higher temperatures and/or for longer periods of time, to effect curing. Such procedures, referred to as "B-staging," can be used to provide binder-treated nonwovens, for example, in roll form, which can be cured later, with or without forming or molding into a particular configuration, concurrent with the curing process.

Suitable substrates include, for example, heat-sensitive substrates, such as wood, including, solid wood, wood particles, fibers, chips, flour, pulp, and flakes; paper and cardboard; textiles, including cotton, linen, wool, and synthetic textiles from polyester, rayon, or nylon, and superabsorbent fibers; vegetable fibers, such as jute, sisal, flax, cotton and animal fibers; as well as heat resistant substrates, such as metal; plastic; fibers, such as glass and mineral fibers, aramid fibers, ceramic fibers, metal fibers, carbon fibers, polyimide fibers, and woven and non-woven fabrics made therefrom. Heat-resistant non-wovens may also contain fibers which are not in themselves heat-resistant such as, for example, polyester fibers, rayon fibers, nylon fibers, and superabsorbent fibers, in so far as or in amounts such that they do not materially adversely affect the performance of the substrate.

Non-woven fabrics are composed of fibers which can be consolidated in whole or in part by mechanical means such as, for example, by entanglement caused by needle-punching, by an air-laid process, and by a wet-laid process; by chemical means such as, for example, treatment with a polymeric binder; or by a combination of mechanical and chemical means before, during, or after nonwoven fabric formation. Some non-woven fabrics are used at temperatures substantially higher than ambient temperature such as, for example, glass fiber-containing non-woven fabrics which are impregnated with a hot asphaltic composition pursuant to making roofing shingles or roll roofing material. When a non-woven fabric is contacted with a hot asphaltic composition at temperatures of from 150° C. to 250° C., the non-woven fabric can sag, shrink, or otherwise become distorted. Therefore, non-woven fabrics which incorporate a curable composition should substantially retain the properties contributed by the cured aqueous composition such as, for example, tensile strength. In addition, the cured composition should not substantially detract from essential non-woven fabric characteristics, as would be the case, for example, if the cured composition were too rigid or brittle or became sticky under processing conditions.

EXAMPLES

These examples illustrate specific binder compositions of this invention and ones that compare to such compositions

Example 1

A 5-liter round-bottom flask equipped with a paddle stirrer, thermocouple, nitrogen inlet, and reflux condenser was charged with 794.4 grams of deionized water, 24.7 grams of sodium hypophosphite monohydrate, 24.0 grams of a sodium lauryl ether sulfate surfactant solution (30%), and 0.059 grams of an inhibitor. The mixture was heated to 79° C. A monomer emulsion was prepared using 510.0 grams deionized water, 90.7 grams of a sodium lauryl ether sulfate surfactant solution (30%), 1092.0 grams of butyl acrylate, 449.9 grams of styrene, and 272.1 grams of acrylic acid. A 90.1 gram aliquot of this monomer emulsion was added to the reaction flask, followed by a solution of 7.5 grams of ammonium persulfate dissolved in 38.1 grams of deionized water. After an exotherm and while maintaining a reaction temperature of 86° C., the monomer emulsion and a separate solution of 7.5 grams of ammonium persulfate in 235.6 grams of deionized water were gradually added over a total time of 130 minutes. After these additions were complete a solution of 46.5 grams of sodium hydroxide dissolved in 282.0 grams deionized water was added. A solution of 0.022 grams of ferrous sulfate heptahydrate in 14.4 grams deionized water and a solution of 0.022 grams of ethylene diamine tetraacetate, tetra sodium salt, dissolved in 0.20 grams of deionized water was added to the reaction mixture. A solution of 8.0 grams of aqueous tert-butylhydroperoxide (70%) diluted with 35.9 grams deionized water and a solution of 5.4 grams of sodium bisulfite dissolved in 68.1 grams of deionized water were gradually added to the reaction mixture. After a brief hold, a solution of 8.0 grams of aqueous tert-butylhydroperoxide (70%) diluted with 35.9 grams deionized water and a solution of 5.4 grams of sodium bisulfite dissolved in 68.1 grams of deionized water were gradually added to the reaction mixture. After addition of these solutions was complete, the reaction mixture was cooled to room temperature. When the reaction mixture was cool, a biocide and 16.9 grams of deionized water was added, and the latex was filtered. The resulting latex had a solids content of roughly 47.0%.

Examples 2-7

These latex samples were prepared by the same procedure. A 5-liter round-bottom flask equipped with a paddle stirrer, thermocouple, nitrogen inlet, and reflux condenser was charged with 716.9 grams of deionized water, 26.8 grams of sodium hypophosphite monohydrate, 28.5 grams of a sodium lauryl ether sulfate surfactant solution (30%), 3.1 grams of sodium hydroxide, and 0.058 grams of an inhibitor. The mixture was heated to 79° C. A monomer emulsion was prepared according to the recipe shown in Table A. A 96.4 gram aliquot of this monomer emulsion was added to the reaction flask, followed by a solution of 7.3 grams of ammonium persulfate dissolved in 37.9 grams of deionized water. After an exotherm and while maintaining a reaction temperature of 86° C., the monomer emulsion and a separate solution of 7.3 grams of ammonium persulfate in 165.4 grams of deionized water were gradually added over a total time of 130 minutes. After these additions were complete a solution of 42.0 grams of sodium hydroxide dissolved in 399.4 grams deionized water was added. A solution of 0.022 grams of ferrous sulfate heptahydrate in 4.8 grams deionized water and a solution of 0.022 grams of ethylene diamine tetraacetate, tetra sodium salt, dissolved in 4.8 grams of deionized water was added to the reaction mixture. A solution of 7.9 grams of aqueous tert-butylhydroperoxide (70%) diluted with 36.1 grams deionized water and a solution of 5.2 grams of sodium bisulfite dissolved in 67.2 grams of deionized water were gradually added to the reaction mixture. After a brief hold, a solution of 7.9 grams of aqueous tert-butylhydroperoxide (70%) diluted with 36.1 grams deionized water and a solution of 5.2 grams of sodium bisulfite dissolved in 67.2 grams of deionized water were gradually added to the reaction mixture. After addition of these solutions was complete, the reaction mixture was cooled to room temperature. When the reaction mixture was cool, a biocide and 17.1 grams of deionized water was added and the latex was filtered. The resulting latex had a solids content of roughly 47.0%.

TABLE 1

Monomer Emulsion Recipes for Latex Samples 2-7 (weights in grams)

| | Example 2 | Example 3 | Example 4 | Example 5 | Example 6 | Example 7 |
|---|---|---|---|---|---|---|
| Deionized water | 456.83 | 456.83 | 456.83 | 456.83 | 456.83 | 456.83 |
| Sodium lauryl ether sulfate surfactant (30%) | 88.67 | 88.67 | 88.67 | 88.67 | 88.67 | 88.67 |
| Butyl acrylate | 1072.26 | 1072.26 | 1072.26 | 1072.26 | 1072.26 | 1072.26 |
| Styrene | 437.27 | 432.82 | 423.91 | 406.10 | 388.29 | 406.10 |
| Acrylic acid | 267.17 | 267.17 | 267.17 | 267.17 | 267.17 | 267.17 |
| Allyl methacrylate | 4.45 | 8.90 | 17.81 | 35.62 | 53.43 | |
| Divinyl benzene (55%) | | | | | | 64.77 |

Example 8

Comparative Example A—Carboxy Emulsion Copolymer with 1.5% Acrylic Acid

A 5-liter round-bottom flask equipped with a paddle stirrer, thermocouple, nitrogen inlet, and reflux condenser was charged with 798.2 grams of deionized water and 3.6 grams of a sodium lauryl ether sulfate surfactant solution (30%). The mixture was heated to 79° C. A monomer emulsion was prepared using 456.8 grams of deionized water, 113.4 grams of a sodium lauryl ether sulfate surfactant solution (30%), 1021.5 grams of butyl acrylate, 715.1 grams styrene, 26.7 grams of acrylic acid, and 17.8 grams of allyl methacrylate. A 96.4 gram aliquot of this monomer emulsion was added to the reaction flask, followed by a solution of 7.3 grams of ammonium persulfate dissolved in 37.9 grams of deionized water. After an exotherm and while maintaining a reaction temperature of 86° C., the monomer emulsion and a separate solution of 7.3 grams of ammonium persulfate in 165.4 grams of deionized water were gradually added over a total time of 130 minutes. After these additions were complete a solution of 0.022 grams of ferrous sulfate heptahydrate in 4.8 grams deionized water and a solution of 0.022 grams of ethylene diamine tetraacetate, tetra sodium salt, dissolved in 4.8 grams of deionized water was added to the reaction mixture. A solution of 7.9 grams of aqueous tert-butylhydroperoxide (70%) diluted with 36.1 grams deionized water and a solution of 5.2 grams of sodium bisulfite dissolved in 67.2 grams of deionized water were gradually added to the reaction mixture. After a brief hold, a solution of 7.9 grams of aqueous tert-butylhydroperoxide (70%) diluted with 36.1 grams deionized water and a solution of 5.2 grams of sodium bisulfite dissolved in 67.2 grams of deionized water were gradually added to the reaction mixture. After addition of these solutions was complete, the reaction mixture was cooled to room temperature. When the reaction mixture was cool, a biocide and 17.1 grams of deionized water was added and the latex was filtered. The resulting latex had a solids content of roughly 50.0%.

Example 9

Comparative Example B—Thermoset Composition with β-Hydroxyamide Polyol

A 5-liter round-bottom flask equipped with a paddle stirrer, thermocouple, nitrogen inlet, and reflux condenser was charged with 597.5 grams of deionized water, 20.0 grams of sodium hypophosphite monohydrate, 23.6 grams of a sodium lauryl ether sulfate surfactant solution (30%), 2.6 grams of sodium hydroxide, and 0.048 grams of an inhibitor. The mixture was heated to 79° C. A monomer emulsion was prepared using 380.7 grams of deionized water, 73.9 grams of a sodium lauryl ether sulfate surfactant solution (30%), 893.6 grams of butyl acrylate, 353.3 grams of styrene, 222.6 grams of acrylic acid, and 14.8 grams of allyl methacrylate. A 80.3 gram aliquot of this monomer emulsion was added to the reaction flask, followed by a solution of 6.1 grams of ammonium persulfate dissolved in 31.6 grams of deionized water. After an exotherm and while maintaining a reaction temperature of 86° C., the monomer emulsion and a separate solution of 6.1 grams of ammonium persulfate in 138.0 grams of deionized water were gradually added over a total time of 130 minutes. After these additions were complete a solution of 35.0 grams of sodium hydroxide dissolved in 332.4 grams deionized water was added. A solution of 0.018 grams of ferrous sulfate heptahydrate in 4.0 grams deionized water and a solution of 0.018 grams of ethylene diamine tetraacetate, tetra sodium salt, dissolved in 4.0 grams of deionized water was added to the reaction mixture. A solution of 6.5 grams of aqueous tert-butylhydroperoxide (70%) diluted with 30.1 grams deionized water and a solution of 4.3 grams of sodium bisulfite dissolved in 56.0 grams of deionized water were gradually added to the reaction mixture. After a brief hold, a solution of 6.5 grams of aqueous tert-butylhydroperoxide (70%) diluted with 30.1 grams deionized water and a solution of 4.3 grams of sodium bisulfite dissolved in 56.0 grams of deionized water were gradually added to the reaction mixture. After addition of these solutions was complete, the reaction mixture was cooled to approximately 50° C. whereupon a solution of 247.6 grams of material of Example 10, 14.7 grams of sodium hypophosphite monohydrate, and 89.1 grams of deionized water was gradually added to the reaction mixture. After the addition of this solution was complete the reaction mixture was cooled. When the reaction mixture was cool, a biocide and 14.4 grams of deionized water was added and the latex was filtered. The resulting latex had a solids content of roughly 49.5%.

Example 10

β-Hydroxyamide—Reaction Product of ε-Caprolactone and Diethanolamine

Prior art polyacid thermoset compositions often utilize added polyol crosslinkers. The advantageous use of such polyols is exemplified by hydroxyamide crosslinkers which include those described in Swift U.S. Pat. No. 4,076,917, and Arkens EP Patent No. 0,512,732. Example 9 (Comparative Example B) illustrates the use of a β-hydroxyamide polyol as is known in the art. The synthesis of the β-hydroxyamide is as follows:

To a 1 L flask equipped with a condenser, a thermocouple, and a mechanical stirrer was added 157.5 grams (1.5 moles) of diethanolamine (DEOA). Starting at room temperature under one atmosphere of nitrogen, and without external heating, 171.2 grams (1.5 moles) of ε-caprolactone was added to the reaction flask by pipette in small aliquots over the course of 1 hour. The reaction mixture exhibited a slight exotherm to 31° C. After the addition of ε-caprolactone was complete, the reaction mixture was stirred for another hour. After that hour, 82.0 grams of deionized water were added yielding an 80% active material. This product was used in Example 9 (Comparative Example B).

TABLE 2

Compositions of Latex Emulsion Copolymers

| Polymer | Composition |
|---|---|
| Ex. 1 | 60.2 BA/24.8 STY/15 AA |
| Ex. 2 | 60.2 BA/24.55 STY/15 AA/0.25 ALMA |
| Ex. 3 | 60.2 BA/24.3 STY/15 AA/0.5 ALMA |
| Ex. 4 | 60.2 BA/23.8 STY/15 AA/1 ALMA |
| Ex. 5 | 60.2 BA/22.8 STY/15 AA/2 ALMA |
| Ex. 6 | 60.2 BA/21.8 STY/15 AA/3 ALMA |
| Ex. 7 | 60.2 BA/22.8 STY/15 AA/2 DVB |
| Ex. 8 | 57.35 BA/40.15 STY/1.5 AA/1 ALMA |
| Ex. 9 | 60.2 BA/23.8 STY/15 AA/1 ALMA + β-Hydroxyamide |

Example 11

Preparation of Pre-Cooked Starch

For the binder samples 1-9 below, the starch is processed as follows. To a one-quart stainless steel container, 455 grams of water is weighed and the container clamped in a water-bath which has been pre-heated and maintained at 85° C. The level of water in the water bath is maintained higher than the level of water in the container. A stirring blade attached to a benchtop stirrer is positioned within the water such that it does not hit the sides or bottom of the container. The stirrer is turned on to a speed sufficient to provide a strong vortex. 245 grams of starch (Penford Gum 295) is weighed into a paper cup, then added slowly to the stirring water. Once at temperature, timing is begun, and the mixture is cooked for 25 minutes at 85° C. After the 25 minute cooking time, the mixture is removed from the water bath. Before adding to the binder formulation, the starch mixture is diluted with room temperature water to about 10-15% solids, and stirred to constant consistency.

For the embodiment that contemplates addition of a polybasic carboxylic acid, anhydride or salt thereof, anhydrous citric acid (27.2 grams) is weighed into the same paper cup along with the starch (245.0 grams), and the dry mixture is then added to the stirring water secured in the heated water bath. The procedure is otherwise as described above.

TABLE 3

Preparation of Binder Samples 1-7

| Sample | g. Emulsion | g. Starch[1] | g. H$_2$O |
|---|---|---|---|
| 1 | 75.00 Ex. 1 | 151.65 | 510.54 |
| 2 | 75.00 Ex. 2 | 148.31 | 497.63 |
| 3 | 75.00 Ex. 3 | 149.72 | 503.09 |
| 4 | 75.00 Ex. 4 | 150.08 | 504.46 |
| 5 | 75.00 Ex. 5 | 150.30 | 505.33 |
| 6 | 75.00 Ex. 6 | 150.11 | 504.58 |
| 7 | 75.00 Ex. 7 | 152.29 | 513.02 |
| Comp. A | 75.00 Ex. 8 | 153.51 | 517.74 |
| Comp. B | 75.00 Ex. 9 | 154.80 | 522.70 |

[1]The starch is Penford ® Gum 295 hydroxyethylated starch; 30% by weight in water, cooked at 85° C. for 25 minutes prior to addition to formulation.

Test Methods:
Mat Preparation:

Commercial polyester spunbond mat (non-treated) is cut into 15"×12" sheets. Sheets are dip coated in test binder formulation at 11% bath solids (by weight). Soaked sheets are padded at 40 psi and then immediately cured at 200° C. for 3 minutes. Binder add-on is about 20% by weight.

Room Temperature Testing of Tensile Strength and Elongation

An Instron 4201 tensile tester equipped with a 1 kN load cell and an oven chamber encasing the jaws with temperature range of −100 to 400° F. (−73° C. to 204° C.) capability was used for both room temperature (RT) tensile strength and elongation, and high temperature (hot) tensile strength and width retention.

For RT tensile strength and RT elongation, a cured sheet was cut into 1½"×10" strips. Strips were tested by placing them in the jaws of the tensile tester and pulled apart at a crosshead speed of 8 inches/minute with a 6" gap. The maximum RT tensile strength is measured, and expressed in Newtons. Elongation (strain) is measured at maximum RT tensile strength, and expressed as %.

Hot Tensile Strength and Hot Width Retention

A cured sheet is cut into 2"×12" strips. The oven chamber of the tensile tester is pre-heated to 375° F. (190° C.) prior to testing. Once pre-heated, the strips are placed in the jaws and the oven chamber closed and equilibrated back to 375° F. The samples are then pulled apart at a crosshead speed of 8 inches/minute with a 8" gap. Hot Tensile Strength is measured at 20% elongation (strain), and expressed in Newtons. Hot Width Retention is calculated by measuring the width of the test strip at the narrow point and dividing this by the initial width, expressed as a percent. Hot Width Retention is a measure of the substrate's thermal dimensional stability.

Water Uptake

A mixture of water-soluble dye in water is added to a 1-quart glass jar to a height of 20 mm from the bottom. A 2" by 10" strip of cured sheet is placed lengthwise in the jar. All cured sheets samples are placed at the same angle in the glass jar. The vertical height that the water migrates up the cured sheet is recorded after 48 hours submersion in the water-soluble dye solution. Lower water uptake is preferred. The inventive compositions show good water uptake performance. Inventive Binder Example 4 has a water uptake of just 6 mm, compared to a water uptake of 89 mm for a commercial UF/SBR control (90 urea-formaldehyde resin to 10 parts styrene butadiene rubber latex).

TABLE 4

Hot and Room Temperature Tensile Test Results: Samples 1-9

| Sample | Hot TS (N) | Hot Width (%) | RT TS (N) | RT Elong. (%) |
|---|---|---|---|---|
| 1 | 55 | 60 | 581 | 45 |
| 2 | 79 | 61 | 600 | 45 |
| 3 | 96 | 65 | 533 | 41 |
| 4 | 121 | 69 | 578 | 43 |
| 5 | 151 | 71 | 562 | 41 |
| 6 | 166 | 78 | 553 | 35 |
| 7 | 103 | 67 | 554 | 44 |
| Comp. A | 36 | 59 | 593 | 47 |
| Comp. B | 134 | 68 | 557 | 41 |
| Comp. C[1] | 120 | 76 | 327 | 18 |

[1]Comp. C is a commercial thermosetting binder, Aquaset ™ 600 (Rohm and Haas Company, Philadelphia, PA, USA), which is crosslinked with triethanolamine.

For many end-use applications, only the room temperature properties are important. It can be seen that the room temperature properties of the inventive composition, as exemplified by Example 1, are comparable to those of the comparative examples, Comp.A and Comp.B, and superior to Comp.C. Thus, for many applications, this inexpensive binder composition may find utility.

Binder Examples 1-7 illustrate the effect of a multi-ethylenically unsaturated monomer, copolymerized into the carboxy emulsion copolymer backbone in small quantities. These examples show increasing hot tensile strength and hot width retention with increasing levels of multi-ethylenically unsaturated monomer and demonstrate a high performance profile even without the use of expensive polyol crosslinkers. Moreover, the inventive compositions show much improved flexibility compared to current polyacid/polyol technologies (Comp.C).

The inventive compositions thus provide an inexpensive, formaldehyde-free, thermoset binder that retains both flexibility and strength after cure.

I claim:
1. An aqueous composition comprising:
 a) polymer particles of at least one polycarboxy emulsion copolymer comprising as copolymerized units, based on the weight of the emulsion copolymer solids:
  i) from 5-40% by weight of a carboxy acid monomer, and
  ii) from 0.1 to 5 weight percent of a multi-ethylenically unsaturated monomer; and,
 b) at least one binder selected from the group consisting of a polysaccharide which is a water-insoluble starch with a weight average molecular weight of between 10,000 and 10,000,000, the binder being present in a weight percent on total composition binder solids of from 20-95%,
wherein the binder is pre-cooked with a polybasic carboxylic acid, anhydride or salt thereof, having a weight average molecular weight of 1000 or less.

2. The aqueous composition of claim 1 wherein the carboxy acid monomer is acrylic acid.

3. The aqueous composition of claim 2 wherein the amount of acrylic acid, as copolymerized units, is from 10 to 20% by weight, based on the weight of polycarboxy emulsion copolymer solids.

4. The aqueous composition of claim 1 wherein the multi-ethylenically unsaturated monomer is allyl methacrylate.

5. The aqueous composition of claim 1 wherein the binder comprises a water-soluble starch with a weight average molecular weight of less than 10,000.

6. The aqueous composition of claim 1 wherein the binder comprises defatted soy flour.

7. The aqueous composition of claim 1 wherein the polycarboxy emulsion copolymer comprises copolymerized acrylonitrile.

8. The aqueous composition of claim 1 further comprising a phosphorus-containing compound.

* * * * *